United States Patent [19]

Gilman

[11] Patent Number: 4,580,074
[45] Date of Patent: Apr. 1, 1986

[54] PIEZOELECTRIC TRANSDUCER WITH CODED OUTPUT SIGNAL

[75] Inventor: John D. Gilman, Mexico, Mo.

[73] Assignee: General Motors Corporation, Detroit, Mich.

[21] Appl. No.: 674,867

[22] Filed: Nov. 26, 1984

[51] Int. Cl.[4] .......................................... H01L 41/08
[52] U.S. Cl. ................................. 310/339; 310/319; 310/800
[58] Field of Search ............... 310/311, 319, 338, 339, 310/800

[56] References Cited

U.S. PATENT DOCUMENTS

| | | | |
|---|---|---|---|
| 3,350,583 | 10/1967 | Schiavone | 310/339 X |
| 3,397,328 | 8/1968 | Schafft | 310/339 |
| 3,464,531 | 9/1969 | Herr et al. | 310/339 X |
| 3,648,279 | 3/1972 | Watson | 310/339 X |
| 3,940,637 | 2/1976 | Ohigashi et al. | 310/339 |
| 3,976,899 | 8/1976 | Fanshawe | 310/339 |
| 4,378,552 | 3/1983 | Jalbert | 310/339 X |
| 4,379,245 | 4/1983 | Goldstein | 310/339 X |
| 4,409,548 | 10/1983 | Focht | 310/339 X |
| 4,430,595 | 2/1984 | Nakasone et al. | 310/339 |

FOREIGN PATENT DOCUMENTS 396475 1/1974 U.S.S.R. .............................. 310/339

OTHER PUBLICATIONS

I.B.M Technical Disclosure Bulletin, Piezo-Electric Crystal Keyboard by J. J. Sharp; vol. 5, No. 10, Mar. 1963.

Primary Examiner—Mark O. Budd
Attorney, Agent, or Firm—Warren D. Hill

[57] ABSTRACT

A transducer responsive to a mechanical input produces a binary coded electrical signal on a single data bus. A plurality of piezoelectric elements each produce a voltage pulse when stressed and an actuator applies stress to the elements to generate a sequence of voltage pulses. The elements are coupled to the data bus according to polarity to establish a coded sequence of polarized pulses.

3 Claims, 6 Drawing Figures

PIEZOELECTRIC TRANSDUCER WITH CODED OUTPUT SIGNAL

This invention relates to a piezoelectric transducer and more particularly to such a transducer producing a binary coded electrical output signal in response to a mechanical input.

It is desirable in certain control systems, for example, automotive vehicle controls for door locks, power windows, lights and other functions, to transmit multiplexed control signals from a plurality of sending stations to several remote receiving stations over a common data bus comprising a single conductor. Each sending station emits a unique binary coded electrical signal and the corresponding receiving station is responsive only to that signal. Thus, the coded signals are the basis for the multiplexing scheme. It is desirable then to provide a transducer responsive to an operator imput for emitting a binary coded electrical signal, which transducer is characterized by reliability, long life, and low cost. It is also desirable to provide such a transducer which requires no electrical input. It has previously been proposed to use piezoelectric transducers responsive to manual actuation for producing a plurality of signals and coupling the transducers in a coded manner to a multiconductor array such that a particular combination of conductors will be energized when the piezoelectric transducers are actuated. That proposal fails to meet the requirement of a one-conductor data bus.

It is, therefore, an object of the invention to provide a transducer for producing a binary coded electrical signal for transmission by a one-conductor data bus and it is a further object of the invention to provide such a transducer for generating a serial pulse train of binary bits.

The invention is carried out by providing a transducer having several piezolectric elements for producing voltage pulses when stressed, an actuator for sequentially applying stress to the piezoelectric elements to generate a sequence of voltage pulses, and electrical connections for coupling the elements to an output line according to polarity to establish a coded sequence of polarized pulses.

The invention further comprehends such a transducer wherein each piezoelectric element is actuated by a corresponding snap spring, the springs for the several elements having different actuation force values and the elements being arranged in a stack and subject to a single push button force so that, in response to that force, the snap springs are actuated in a sequence determined by the order of the actuation force values.

The above and other objects of the invention will become more apparent from the following description taken in conjunction with the accompanying drawings wherein like reference numerals refer to like parts and wherein.

Figure 1:
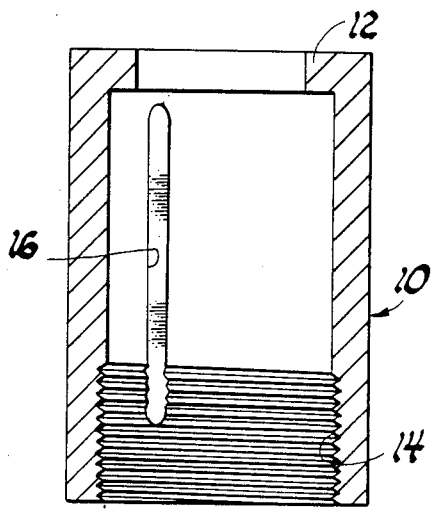
FIG. 1 is an exploded, partially cross-sectional view of a piezoelectric transducer according to the invention.
Figure 1:
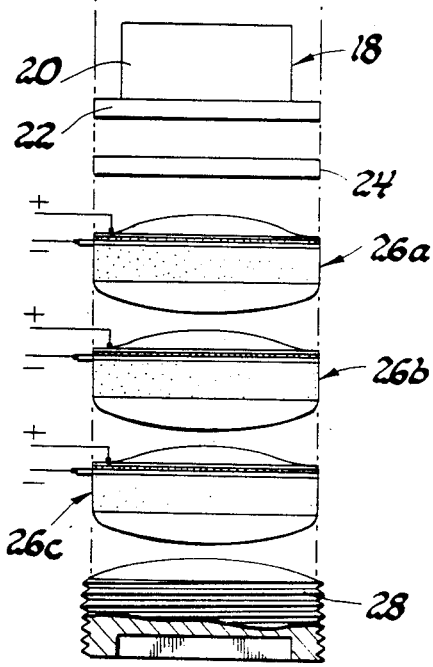

FIG. 1 shows a transducer housing 10 in the form of a tube having a small in-turned flange 12 at the upper end and an internally threaded section 14 at the lower end. A slot 16 elongated in the direction of the axis of the housing 10 is formed in the side of the housing. A hat shaped push button 18 has a button portion 20 sized to extend through the aperture in the upper end of the housing 12 and a lower flange 22 to engage the bottom of the housing flange 12. The push button 18 is the first of several stacked members contained in the housing 10. The second member in the stack is a plate 24 which is followed by several pulse generating units 26a, 26b and 26c. Although three pulse generating units are shown in the drawing, a different number may be used as determined by the number of binary pulses desired in the output signal. Each of the pulse generating units has an outer configuration of a thick disc with convex upper and lower surfaces and has an upper and a lower lead denoted as positive and negative, respectively. A threaded plug 28 for engaging the internal threads 14 of the housing secures the other members within the housing and provides adjustments of the compression force on the pulse generating units 26a, b and c.

Figure 2:
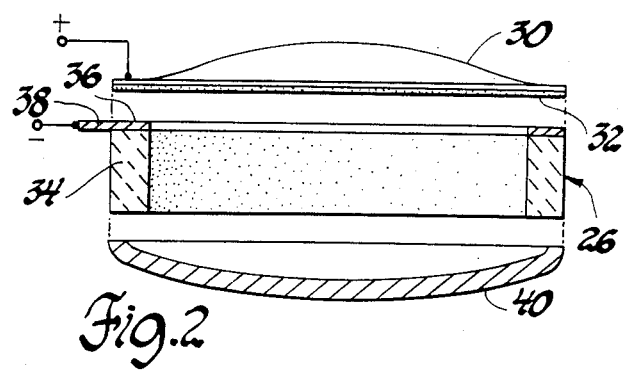
FIG. 2 is an exploded, partially cross-sectional view of one of the pulse generating units of FIG. 1.
Figure 3:
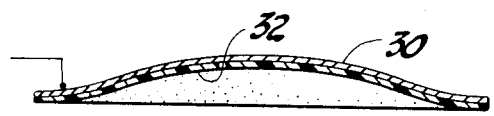
FIG. 3 is a cross-sectional view of a snap spring with a piezoelectric film used in the pulse generating unit of FIG. 2.

FIG. 2 is an exploded view of a pulse generating unit 26 that includes a snap spring 30 which, along with the push button 18, provides actuation of the piezoelectric material and also which serves as an upper cover. As shown in FIG. 3, a piezoelectric polymer film 32 is glued to the under surface of the snap spring 30. Preferably the polymer film material is polyvinylidine flouride (PVDF). An annulus 34 of insulating material provides sidewalls of the unit and the opening defined by the annulus allows the snap spring to over-center when it is depressed. The upper end surface of the annulus carries a conductive layer or terminal 36 engaging the polymer film 32 around its rim. A tab 38 laterally extending from the terminal allows the connection of an output lead thereto. The snap spring 30 serves as the other terminal for the polymer film 32 and another output lead is attached as by soldering to the snap spring. A domed lower cover 40 is affixed to the lower end of the annulus 34 to complete the assembly.

The domed snap spring 30 is preferably a thin spring steel disc formed into a convex shape. When force is applied to the convex side of the snap spring 30 it will, when a preset force value is reached, snap over-center to stress piezoelectric polymer film 32 and generate a voltage pulse having the polarity indicated at the leads. Tests conducted with such an arrangement employing ⅜ inch diameter snap springs yielded maximum pulses ranging from 10 to 15 volts. When the force is released from the snap spring 30, it will snap back to its original shape and the resultant relaxation of the piezoelectric film 32 causes the induction of another voltage pulse of opposite polarity across the film. Arrangements can be made to prevent transmission of that relaxation signal if so desired.

Figure 4:
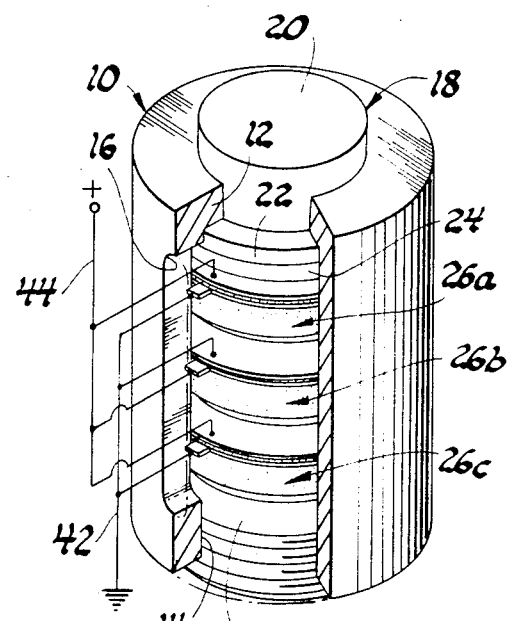
FIG. 4 is partly broken away isometric view of a piezoelectric transducer assembly according to the invention.
Figure 5:
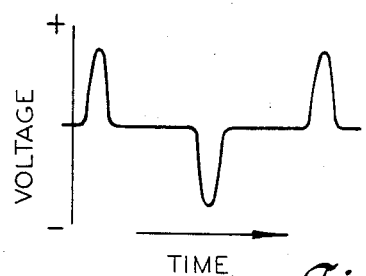
FIG. 5 is an illustration of a coded electrical signal waveform emitted by the transducer of FIG. 4.

FIG. 4 illustrates the transducer as completely assembled with a portion of the housing 10 broken away. Positive and negative leads from each of the signal generating units 26a, b and c extend through the slot 16 in the housing 10 for a connection to a ground conductor 42 and to a data bus or signal conductor 44 which carries the input signal from the transducer. For the example shown in FIG. 4, the signal generating units 26a and 26c have grounded negative leads and positive leads connected to the signal conductor 44, whereas the signal generating unit 26b has its positive lead grounded and the negative lead connected to the signal conductor 44. Each of the signal generating units has a snap spring actuation force different from that of the others so that upon application of a force the units will be actuated one at a time. The output signal occuring when the button 20 is depressed comprises a series of voltage pulses having a polarity corresponding to the polarity of the respective lead connected to the signal conductor 44. If the snap spring for the generating unit 26a actuates at a lower force value than that for 26b and the snap spring for 26b actuates at a lower force value than that for 26c, the resulting binary coded electrical signal on the conductor 44 will be a sequence of pulses in the order of positive, negative and positive as illustrated in FIG. 5. Thus, a transducer incorporating three signal generating units as illustrated will be capable of producing eight different codes in accordance with the manner of connection of the leads to the ground and signal conductors 42, 44. If four signal generating units are employed, then 16 different codes can be realized.

Figure 6:
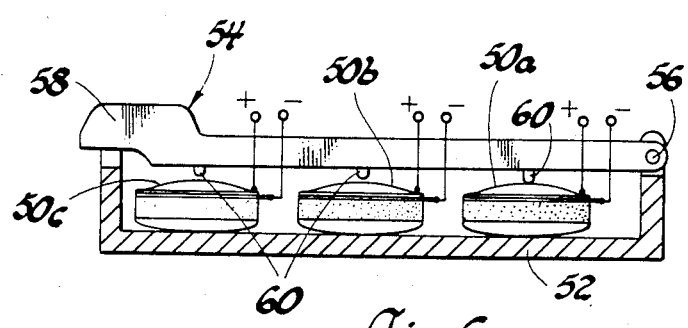
FIG. 6 is a cross-sectional elevational view of another embodiment of a transducer according to the invention.

FIG. 6 shows another transducer embodiment using the same principle of producing a sequence of pulses each having a polarity determined by a wiring code and using generating units 50 that are like units 26. In this case, the signal generating units 50a, 50b and 50c are not stacked but rather are arranged side by side in a box-like base 52 and are operated by a single actuating lever 54 pivoted on the base by a pin 56 at one end of the lever and having a push button 58 at the other end of the lever. Projections 60 depending from the lever are arranged to make sequential contact with the signal generating units 50a, 50b and 50c. The snap springs of the signal generating units can have the same actuation force or different forces. The order of actuation is determined by displacement of the snap springs and thus is dependent upon the relative lengths of the projections 60 and the pivotal movement of the lever 54. That is, projections 60 may be of different lengths to assure that signal generating units 50a, 50b and 50c are actuated in a desired order, thus establishing the sequence of pulses emitted by the generating units. The pulse coding is established in the same manner as that illustrated in FIG. 4, that is, by appropriate connection of the positive and negative leads of the signal generating units to a ground line and a data bus or signal conductor, not shown. If the connections were made in the same coded arrangement as in FIG. 4 and the generating units were actuated in the same sequence, then the output signal would resemble that of FIG. 5.

It will thus be seen that, according to the present invention, a manually actuated transducer incorporating force responsive snap springs to actuate piezoelectric materials can provide a binary coded electrical signal, and this is accomplished by a structure which is inexpensive, reliable and has a long life. Moreover, it will be seen that no external power supply is required since the transducer generates its own electrical signal upon application of a mechanical force.

The embodiments of the invention in which an exclusive property or privilege is claimed are defined as follows:

1. A transducer responsive to a mechanical input for producing a binary coded electrical signal comprising;
    a plurality of piezoelectric elements each capable of producing a voltage pulse when stressed,
    a snap spring coupled to each piezoelectric element for applying stress thereto,
    actuator means for sequentially applying stress to the piezoelectric elements via the snap springs in a predetermined order to generate a sequence of voltage pulses, and
    means for electrically coupling the elements to a signal conductor according to polarity to establish a coded sequence of polarized pulses.

2. A transducer responsive to a mechanical input for producing a binary coded electrical signal comprisng;
    a plurality of piezoelectric elements, each element having a pair of terminals and pulse producing piezoelectric material electrically coupled to the terminals,
    a snap spring coupled to each piezoelectrid element for applying stress thereto,
    actuator means including a lever for operating the snap springs in a predetermined order for sequentially applying compressive force to the elements to serially generate a plurality of polarized voltage pulses, and
    code means for coupling a selected one of each pair of terminals to a signal conductor and coupling the other terminals of each pair to ground so that upon actuation a coded sequence of polarized pulses is applied to the signal conductor.

3. A transducer responsive to a mechanical input for producing a binary coded electrical signal comprising;
    a plurality of pulse generating units arranged in a stack, each unit comprising a snap spring with actuation force different from that of other snap springs in the stack thereby establishing an order of snap spring actuation forces, a piezoelectric element arranged to be stressed by snap spring actuation to produce a pulse, and a pair of leads extending from each element,
    means for coupling one lead of each pair selected according to polarity to a signal output means, and
    means for applying actuation force to the stack for sequentially generating pulses according to the order of snap spring actuation forces, the polarity of each pulse at the signal output means being dependent on the lead selection whereby a binary coded signal is produced.

* * * * *